(12) United States Patent
Kida (10) Patent No.: US 11,784,223 B2
(45) Date of Patent: Oct. 10, 2023

(54) SEMICONDUCTOR DEVICE AND MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hirofumi Kida, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 44 days.

(21) Appl. No.: 17/523,071

(22) Filed: Nov. 10, 2021

(65) Prior Publication Data

US 2022/0190113 A1 Jun. 16, 2022

(30) Foreign Application Priority Data

Dec. 11, 2020 (JP) ................. 2020-206174

(51) Int. Cl.
*H01L 29/08* (2006.01)
*H01L 29/78* (2006.01)
(Continued)

(52) U.S. Cl.
CPC ...... *H01L 29/0865* (2013.01); *H01L 29/0869* (2013.01); *H01L 29/2003* (2013.01); *H01L 29/66712* (2013.01); *H01L 29/7802* (2013.01)

(58) Field of Classification Search
CPC ............. H01L 29/0865; H01L 29/0869; H01L 29/2003; H01L 29/66712; H01L 29/7802;
(Continued)

(56) References Cited

U.S. PATENT DOCUMENTS

2012/0080728 A1 4/2012 Malhan
2021/0273083 A1* 9/2021 Yamashiro .............. H01L 29/78

OTHER PUBLICATIONS

Oyo Buturi, "Development of SiO2/GaN MOSFETs on a homo-epitaxial GaN layer", Japanese Journal of Applied Physics, vol. 86, No. 5 (2017) (and English Machine Translation).
(Continued)

*Primary Examiner* — Mohammed R Alam
(74) *Attorney, Agent, or Firm* — POSZ LAW GROUP, PLC (57) ABSTRACT

A compound semiconductor layer in a semiconductor device includes a drift region of a first conductivity type, a JFET region of the first conductivity type disposed above the drift region, a body region of a second conductivity type disposed above the drift region and adjacent to the JFET region, and a JFET embedded region of the second conductivity type or i-type disposed in the JFET region. The JFET region has a bottom surface portion adjacent to the drift region, a side surface portion adjacent to the body region, and an inside portion adjacent to the JFET embedded region, and further has a high concentration portion at the bottom surface portion and the side surface portion. The high concentration portion has an impurity concentration higher than an impurity concentration of the inside portion.

9 Claims, 6 Drawing Sheets

(51) Int. Cl.
*H01L 29/20* (2006.01)
*H01L 29/66* (2006.01)

(58) Field of Classification Search
CPC ........... H01L 29/0657; H01L 29/42376; H01L 29/0634; H01L 29/0878; H01L 29/0882; H01L 29/0886; H01L 29/1058; H01L 29/1608; H01L 29/24
See application file for complete search history.

(56) References Cited

OTHER PUBLICATIONS

Shibata, Daisuke et al., "1.7 kV/1.0 mΩcm2 Normally-off Vertical GaN Transistor on GaN substrate with Regrown p-GaN/AlGaN/GaN Semipolar Gate Structure", IEEE International Electron Devices Meeting (IEDM), 2016, pp. 10.1.1-10.1.4.

Pearton, S. J. et al. "A review of Ga2O3 materials, processing, and devices", Applied Physics Reviews, 2018, vol. 5, No. 1.

* cited by examiner

SEMICONDUCTOR DEVICE AND MANUFACTURING METHOD OF SEMICONDUCTOR DEVICE

CROSS REFERENCE TO RELATED APPLICATION

The present application claims the benefit of priority from Japanese Patent Application No. 2020-206174 filed on Dec. 11, 2020. The entire disclosure of the above application is incorporated herein by reference.

TECHNICAL FIELD

The present disclosure relates to a semiconductor device and a manufacturing method of a semiconductor device.

BACKGROUND

Conventionally, there has been known a semiconductor device including a nitride semiconductor layer.

SUMMARY

The present disclosure provides a semiconductor device and a manufacturing method of a semiconductor device. Each of the semiconductor device includes a compound semiconductor layer including a drift region of a first conductivity type, a JFET region of the first conductivity type disposed above the drift region, a body region of a second conductivity type disposed above the drift region and adjacent to the JFET region, and a JFET embedded region of the second conductivity type or i-type disposed in the JFET region.

BRIEF DESCRIPTION OF DRAWINGS

Objects, features and advantages of the present disclosure will become apparent from the following detailed description made with reference to the accompanying drawings. In the drawings.

DETAILED DESCRIPTION

Next, a relevant technology is described only for understanding the following embodiments. A semiconductor device according to a related art includes a nitride semiconductor layer. The nitride layer includes a drift region of n-type, a junction field-effect transistor (JFET) region of n-type disposed above the drift region, and a body region of p-type disposed above the drift region and adjacent to the JFET region.

When manufacturing the semiconductor device described above, it is conceivable that a trench is formed from an upper surface of the nitride semiconductor layer, in which the drift region of n-type and the body region of p-type are laminated, to reach the drift region through the body region, and then the JFET region is formed by crystal growth in the trench. The JFET region is formed by crystal growth from a surface of the drift region exposed on a bottom surface of the trench and a surface of the body region exposed on a side surface of the trench.

According to the studies by the present inventor, it has been found that a large amount of impurities such as silicon, oxygen, and carbon are incorporated into an initial layer when the JFET region is formed by crystal growth. Therefore, it has been found that, in the JFET region, a high concentration portion having a higher impurity concentration than the inside is formed at a bottom surface portion adjacent to the drift region and a side surface portion adjacent to the body region.

When such a high concentration portion is formed, depletion of the JFET region when the semiconductor device is off is hindered, and the breakdown voltage of the semiconductor device is lowered.

A semiconductor device according to an aspect of the present disclosure includes a compound semiconductor that includes a drift region of a first conductivity type, a JFET region of the first conductivity type disposed above the drift region, a body region of a second conductivity type disposed above the drift region and adjacent to the JFET region, and a JFET embedded region of the second conductivity type or i-type disposed in the JFET region. The JFET region has a bottom surface portion adjacent to the drift region, a side surface portion adjacent to the body region, and an inside portion adjacent to the JFET embedded region, and further has a high concentration portion at the bottom surface portion and the side surface portion. The high concentration portion has an impurity concentration higher than an impurity concentration of the inside portion.

In the semiconductor device described above, the JFET embedded region of the second conductive type or i-type JFET is disposed in the JFET region. Therefore, even if the JFET region has the high concentration portion, depletion of the JFET region is promoted. Thus, the semiconductor device can suppress the decrease in breakdown voltage.

A manufacturing method of a semiconductor device according to another aspect of the present disclosure includes: forming a trench from a surface of a compound semiconductor layer, in which a drift region of a first conductivity type and a body region of a second conductivity type are laminated, to reach the drift region through the body region; forming a JFET region by crystal growth in the trench and stopping the crystal growth of the JFET region before the trench is completely filled, the JFET region made of a compound semiconductor of a first conductivity type; and forming a JFET embedded region by crystal growth in a groove defined by the JFET region in the trench, the JFET embedded region made of a compound semiconductor of the second conductivity type or i-type.

According to the manufacturing method described above, when the JFET region is formed by crystal growth, a high concentration portion is formed in an initial layer of the JFET region. However, according to the manufacturing method, the JFET embedded region of the second conductive type or i-type can be formed in the JFET region. Therefore, in the semiconductor device manufactured by the manufacturing method, depletion of the JFET region is promoted even if the JFET region has the high concentration portion. Thus, the manufacturing method described above can manufacture the semiconductor device in which the decrease in breakdown voltage is suppressed.

Hereinafter, a semiconductor device and a manufacturing method of a semiconductor device to which the technique disclosed in the present disclosure is applied will be described with reference to the drawings. In the following description, components that are substantially common throughout the drawings are designated by a common reference numeral, and the description thereof may be omitted.

Figure 1:
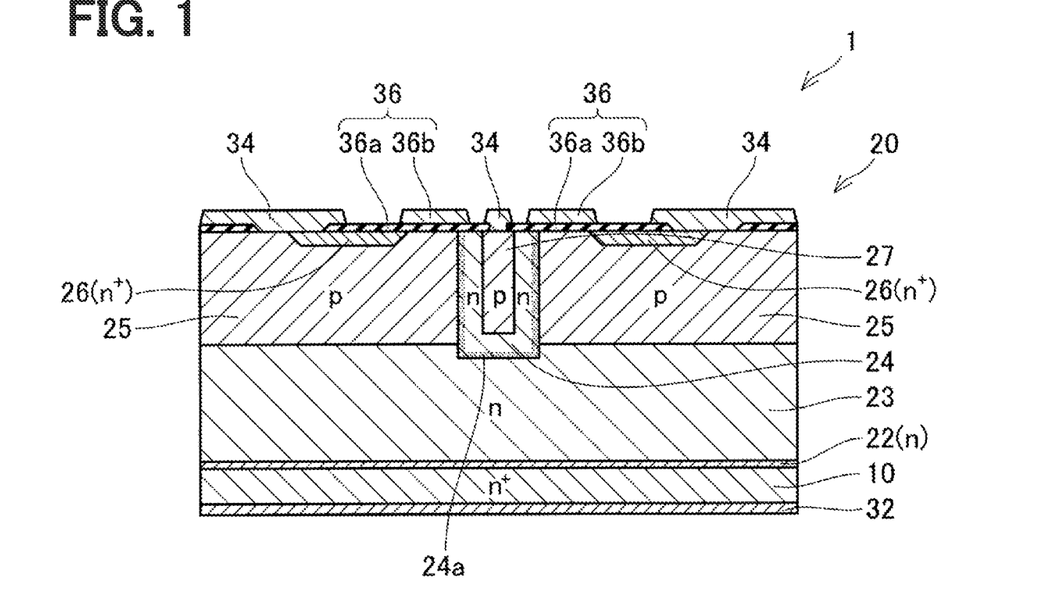
FIG. 1 is a diagram schematically showing a cross-sectional view of a part of a semiconductor device according to an embodiment of the present disclosure.

As shown in FIG. 1, a semiconductor device 1 includes a semiconductor substrate 10 of $n^+$-type, a compound semiconductor layer 20 of a nitride semiconductor layer disposed above the semiconductor substrate 10, and a drain electrode 32 covering a lower surface of the semiconductor substrate 10, source electrodes 34 covering portions of an upper surface of the compound semiconductor layer 20, and insulating gate portions 36 disposed on portions of the upper surface of the compound semiconductor layer 20. The compound semiconductor layer 20 includes a buffer region 22 of n-type, a drift region 23 of n-type, a JFET region 24 of n-type, body regions 25 of p-type, source regions 26 of $n^+$-type, and a JFET embedded region 27 of p-type. The JFET embedded region 27 may be i-type. In this example, a gallium nitride (GaN) semiconductor layer is used as the compound semiconductor layer 20, but instead of this example, for example, a silicon carbide layer or a gallium oxide layer may be used.

The semiconductor substrate 10 is a base substrate on which the compound semiconductor layer 20 made of gallium nitride (GaN) can epitaxially grow from the upper surface thereof, and is, for example, a silicon substrate or a silicon carbide substrate. The semiconductor substrate 10 may be a gallium nitride substrate. The semiconductor substrate 10 is in ohmic contact with the drain electrode 32.

The buffer region 22 is disposed on the semiconductor substrate 10 and is a layer for suppressing the occurrence of lattice distortion between the semiconductor substrate 10 and the compound semiconductor layer 20. The buffer region 22 is, for example, aluminum gallium nitride (AlGaN) containing n-type impurities.

The drift region 23 is disposed on the buffer region 22, and is arranged between the buffer region 22 and the JFET region 24, and between the buffer region 22 and the body regions 25. The drift region 23 is, for example, gallium nitride (GaN) containing n-type impurities.

The JFET region 24 is disposed on the drift region 23, extends from an upper surface of the drift region 23 to the upper surface of the compound semiconductor layer 20 along a thickness direction, and protrudes from the upper surface of the drift region 23. In other words, the JFET region 24 extends from the upper surface of the compound semiconductor layer 20 through the body regions 25 to reach the drift region 23. The JFET region 24 is, for example, gallium nitride (GaN) containing n-type impurities.

The JFET region 24 has a high concentration portion 24a having a high n-type impurity concentration (that is, dopant concentration). In FIG. 1, a portion having a pattern of dots in the JFET region 24 is the high concentration portion 24a. In the JFET region 24, the high concentration portion 24a is arranged at a bottom surface portion adjacent to the drift region 23 and side surface portions adjacent to the body regions 25, and has a higher n-type impurity concentration than an inside portion adjacent to the JFET embedded region 27. The high concentration portion 24a is formed when the JFET region 24 is formed by using the epitaxial crystal growth technique, as will be described in the manufacturing method described later. The high concentration portion 24a is defined as a portion of the JFET region 24 in which the impurity concentration changes. For example, in the high concentration portion 24a, there is a peak of the impurity concentration near a junction surface between the JFET region 24 and the drift region 23, and the impurity concentration decreases toward the inside. Similarly, in the high concentration portion 24a, there is a peak of the impurity concentration near junction surfaces between the JFET region 24 and the body regions 25, and the impurity concentration decreases toward the inside. The impurity concentration is substantially constant in the portion of the JFET region 24 other than the high concentration portion 24a.

The body regions 25 are disposed on the drift region 23, and are arranged on both sides of the JFET region 24 so as to face each other with the JFET region 24 in between. The body regions 25 are, for example, gallium nitride (GaN) containing p-type impurities.

The source regions 26 are respectively disposed on the body regions 25 and are arranged at positions exposed on the upper surface of the compound semiconductor layer 20. The source regions 26 are separated from the drift region 23 and the JFET region 24 by the body regions 25. The source regions 26 are, for example, gallium nitride (GaN) containing n-type impurities. The source regions 26 are in ohmic contact with the source electrodes 34.

The JFET embedded region 27 is disposed in the JFET region 24, and is arranged at a position exposed on the upper surface of the compound semiconductor layer 20. The JFET embedded region 27 is separated from the drift region 23 and the body regions 25 by the JFET region 24. The JFET embedded region 27 is provided so as to be embedded in the JFET region 24 at a position away from the high concentration portion 24a. The JFET embedded region 27 is, for example, gallium nitride (GaN) containing p-type impurities. The JFET embedded region 27 is in ohmic contact with the source electrode 34. Instead of this example, the JFET embedded region 27 may be i-type or may have a floating potential.

The insulating gate portions 36 are disposed on the portions of the upper surface of the compound semiconductor layer 20. Each of the insulating gate portions 36 has a silicon oxide gate insulating film 36a and a polysilicon gate electrode 36b. The gate electrode 36b faces the body region 25 at the portion separating the JFET region 24 and the source region 26 via the gate insulating film 36a.

Next, the operation of the semiconductor device 1 will be described. At the time of use, for example, a positive voltage is applied to the drain electrode 32, and the source electrodes 34 are grounded. When a positive voltage higher than a gate threshold voltage is applied to the gate electrodes 36b, inversion layers are formed in the body regions 25 at the portions separating the JFET region 24 and the source region 26, and the semiconductor device 1 is turned on. At this time, electrons flow from the source region 26 to the JFET region 24 via the inversion layer. The electrons that have flowed into the JFET region 24 flow vertically through the JFET region 24 and head toward the drain electrode 32. As a result, the drain electrode 32 and the source electrodes 34 become conductive.

When the gate electrode 36b is grounded, the inversion layers disappear and the semiconductor device 1 is turned off. At this time, a depletion layer extends into the JFET region 24 from a pn junction surface between the JFET region 24 and the body region 25. However, since the JFET region 24 has the high concentration portion 24a, the extension of the depletion layer from the pn junction surface between the JFET region 24 and the body region 25 is hindered. On the other hand, in the semiconductor device 1, the JFET embedded region 27 is disposed in the JFET region 24. Therefore, a depletion layer extends into the JFET region 24 from a pn junction surface between the JFET region 24 and the JFET embedded region 27. As a result, the JFET region 24 is substantially completely depleted when the semiconductor device 1 is off, so that the semiconductor device 1 can have a high breakdown voltage. Further, since the JFET region 24 is substantially completely depleted, for example, an electric field concentration of the gate insulating films 36a on the JFET region 24 is relaxed. Also in this respect, the semiconductor device 1 can have a high breakdown voltage. Even when the JFET embedded region 27 is i-type, the semiconductor device 1 can have a high breakdown voltage because the depletion of the JFET region 24 is promoted as compared with the case where the JFET embedded region 27 is not provided. Further, even when the potential of the JFET embedded region 27 is floating, the depletion of the JFET region 24 is promoted as compared with the case where the JFET embedded region 27 is not provided, so that the semiconductor device 1 can have a high breakdown voltage.

Figure 2:
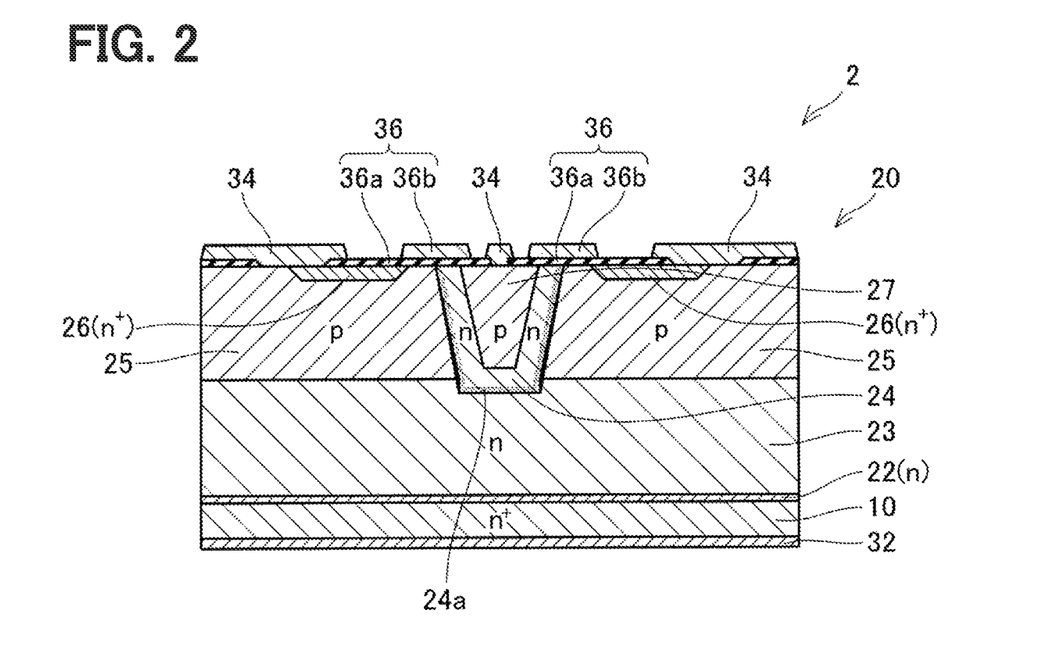
FIG. 2 is a diagram schematically showing a cross-sectional view of a part of a semiconductor device according to another embodiment of the present disclosure.

A semiconductor device 2 shown in FIG. 2 is characterized in that the JFET region 24 has a tapered shape that tapers toward a deep part of the compound semiconductor layer 20. In other words, the JFET region 24 has a tapered shape that tapers downward of the compound semiconductor layer 20. The semiconductor device 2 is further characterized in that the JFET embedded region 27 also has a tapered shape that tapers toward the deep part of the compound semiconductor layer 20. n other words, the JFET embedded region 27 has a tapered shape that tapers downward of the compound semiconductor layer 20. With such a shape, it is possible to suppress the formation of voids when the JFET region 24 and the JFET embedded region 27 are formed by using an epitaxial crystal growth technique. Further, by making the JFET embedded region 27 also tapered, the side surface of the JFET region 24 and the side surface of the JFET embedded region 27 are in a substantially parallel relationship, and the width of the JFET region 24 is substantially constant. As a result, the entire JFET region 24 is satisfactorily depleted, so that the semiconductor device 1 can have a high breakdown voltage.

Figure 3:
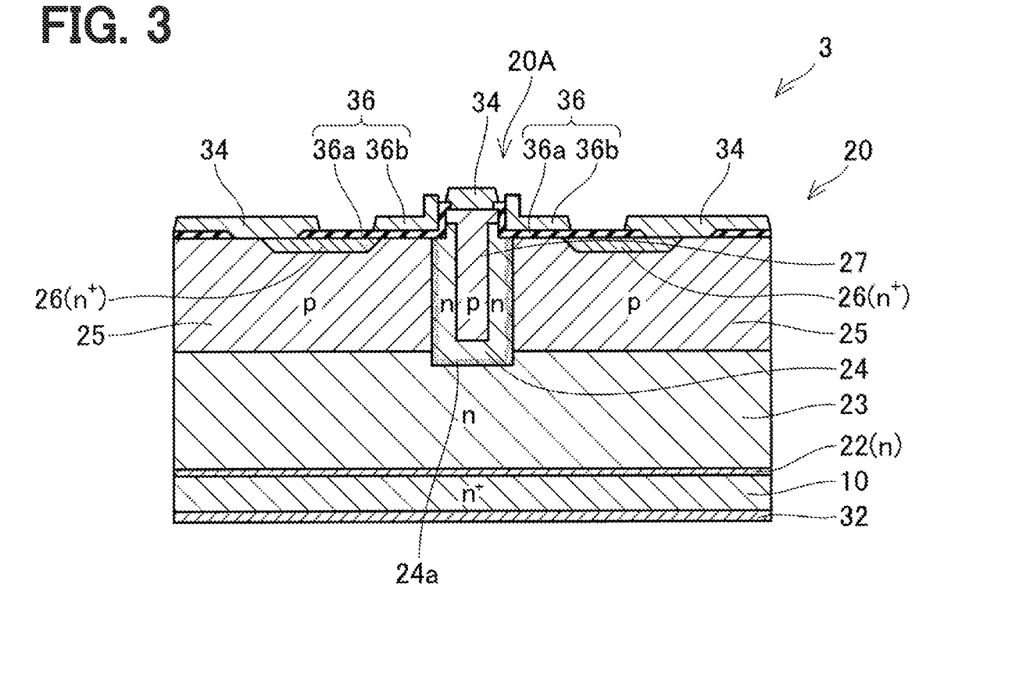
FIG. 3 is a diagram schematically showing a cross-sectional view of a part of a semiconductor device according to another embodiment of the present disclosure.

A semiconductor device 3 shown in FIG. 3 is characterized in that the compound semiconductor layer 20 has a convex portion 20A. The convex portion 20A is formed by being processed into a convex shape so that a part of the upper surface of the compound semiconductor layer 20 protrudes upward. The convex portion 20A is provided in a region between the facing body regions 25, that is, above the JFET region 24. A part of the JFET region 24 and a part of the JFET embedded region 27 are provided in the convex portion 20A.

The convex portion 20A is located inside a region between the facing body regions 25 when viewed from a direction orthogonal to the upper surface of the compound semiconductor layer 20 (that is, when the compound semiconductor layer 20 is viewed in a plan view). In other words, a width of the convex portion 20A is shorter than the distance between the facing body regions 25 in a direction connecting the facing body regions 25 (left-right direction in FIG. 3). As a result, the pn junction surface between the JFET region 24 and the body region 25 is located on a side of the convex portion 20A and is arranged at a position exposed on the upper surface of the compound semiconductor layer 20.

Each of the insulated gate portions 36 is arranged so as to extend from a position facing the source region 26 to a position facing the side surface of the convex portion 20A. In particular, each of the insulating gate portions 36 is arranged so as to face the pn junction surface between the JFET region 24 and the body region 25 exposed on the upper surface of the compound semiconductor layer 20. As a result, the inversion layer formed in the body region 25 between the JFET region 24 and the source region 26 can be reliably connected to the JFET region 24.

The part of the JFET embedded region 27 provided in the convex portion 20A has a T-shaped cross section, and is arranged at a position exposed on the entire top surface of the convex portion 20A. Accordingly, the JFET embedded region 27 can come into contact with the source electrode 34 on the top surface of the convex portion 20A with a large area. The JFET embedded region 27 and the source electrode 34 are electrically connected with a low contact resistance.

Figure 4:
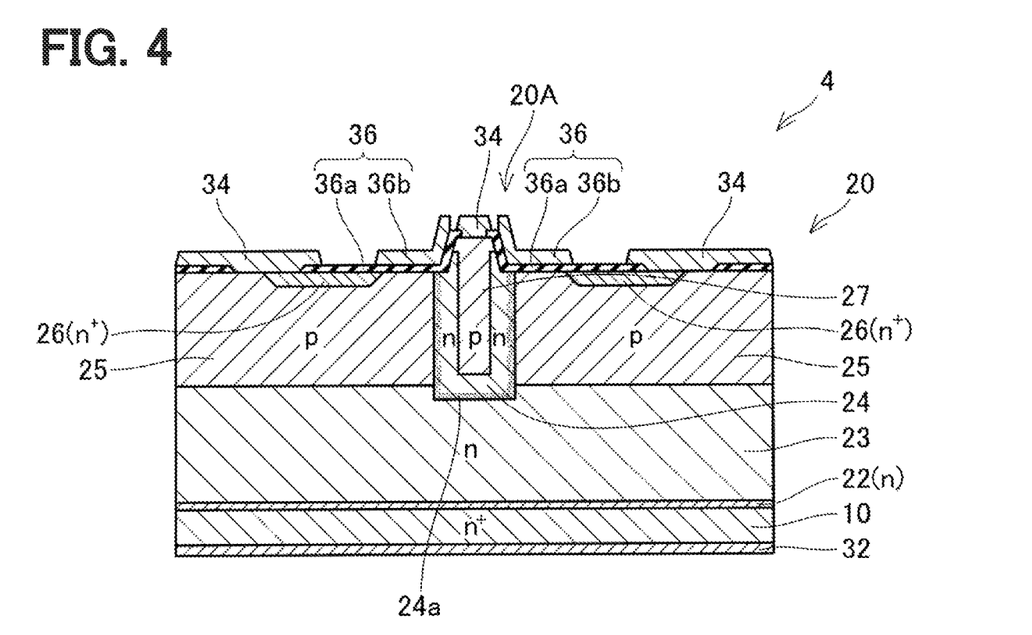
FIG. 4 is a diagram schematically showing a cross-sectional view of a part of a semiconductor device according to another embodiment of the present disclosure.

A semiconductor device 4 shown in FIG. 4 is characterized in that the convex portion 20A has a tapered shape that tapers upward of the compound semiconductor layer 20. According to this shape, an angle of a corner portion formed by the upper surface of the compound semiconductor layer 20 and the side surface of the convex portion 20A becomes large, and the curvature of the insulating gate portion 36 covering the corner portion becomes large. Accordingly, the electric field concentration in the gate insulating film 36a covering the corner portion is relaxed, and the breakdown voltage of the semiconductor device 4 is improved.

(Manufacturing Method of Semiconductor Device 1)

Figure 5:
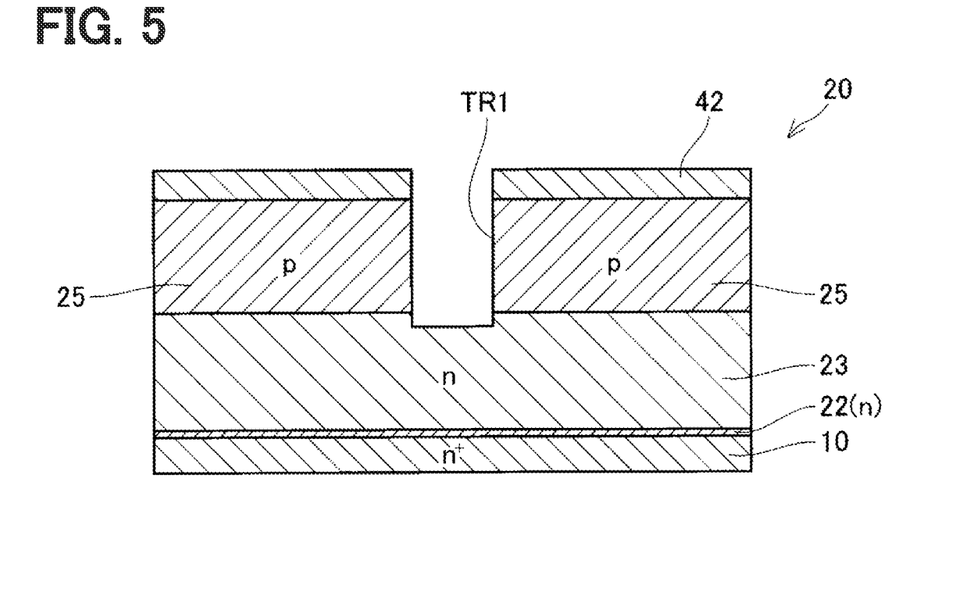
FIG. 5 is a diagram schematically showing a cross-sectional view of the part of the semiconductor device in FIG. 1 in a manufacturing process.

Next, a manufacturing method of the semiconductor device 1 shown in FIG. 1 will be described. First, as shown in FIG. 5, the buffer region 22, the drift region 23, and the body region 25 are laminated in this order from the surface of the semiconductor substrate 10 by using the epitaxial growth technique to prepare the compound semiconductor layer 20. Next, a mask 42 is formed on the upper surface of the compound semiconductor layer 20. The material of the mask 42 is, for example, silicon oxide. Next, using a dry etching technique, a trench TR1 penetrating the body region 25 and reaching the drift region 23 is formed from the surface of the compound semiconductor layer 20 exposed from an opening of the mask 42. The trench TR1 has a depth that penetrates a part of the drift region 23. After forming the trench TR1, the mask 42 is removed. By adjusting the dry etching conditions, the trench TR1 can be processed into a tapered shape. In this case, the semiconductor device 2 shown in FIG. 2 can be manufactured.

Figure 6:
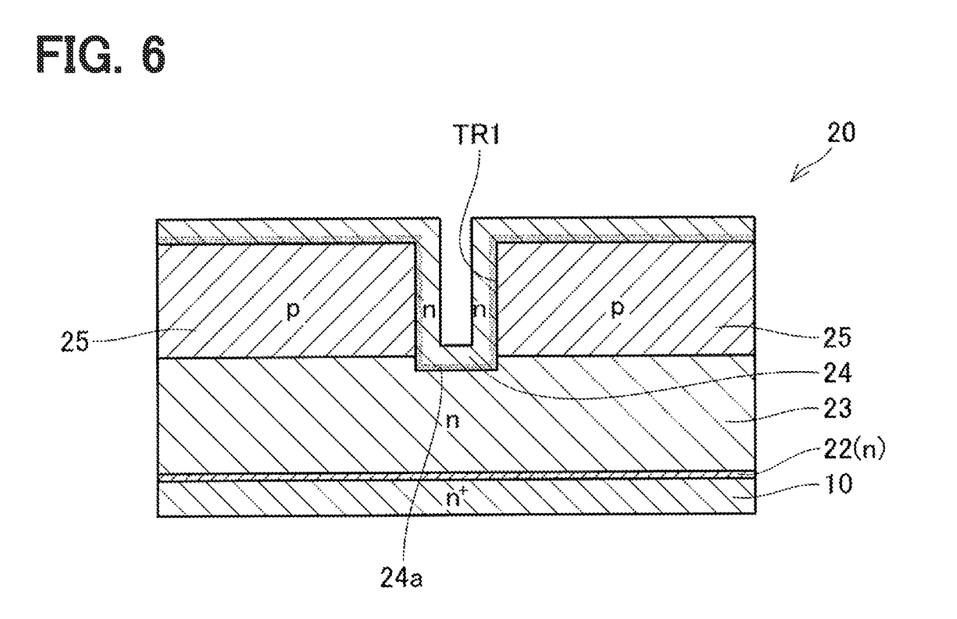
FIG. 6 is a diagram schematically showing a cross-sectional view of the part of the semiconductor device in FIG. 1 in a manufacturing process.

Next, as shown in FIG. 6, the JFET region 24 is formed on the upper surface of the compound semiconductor layer 20 and an inner wall surface of the trench TR1 by crystal growth using the epitaxial growth technique. In the forming of the JFET region 24, the crystal growth of the JFET region 24 is stopped before the trench TR1 is completely filled. As shown in FIG. 6, a large amount of impurities such as silicon, oxygen, and carbon are incorporated into an initial layer when the JFET region 24 is formed by crystal growth, and a high concentration portion 24a is formed.

Figure 7:
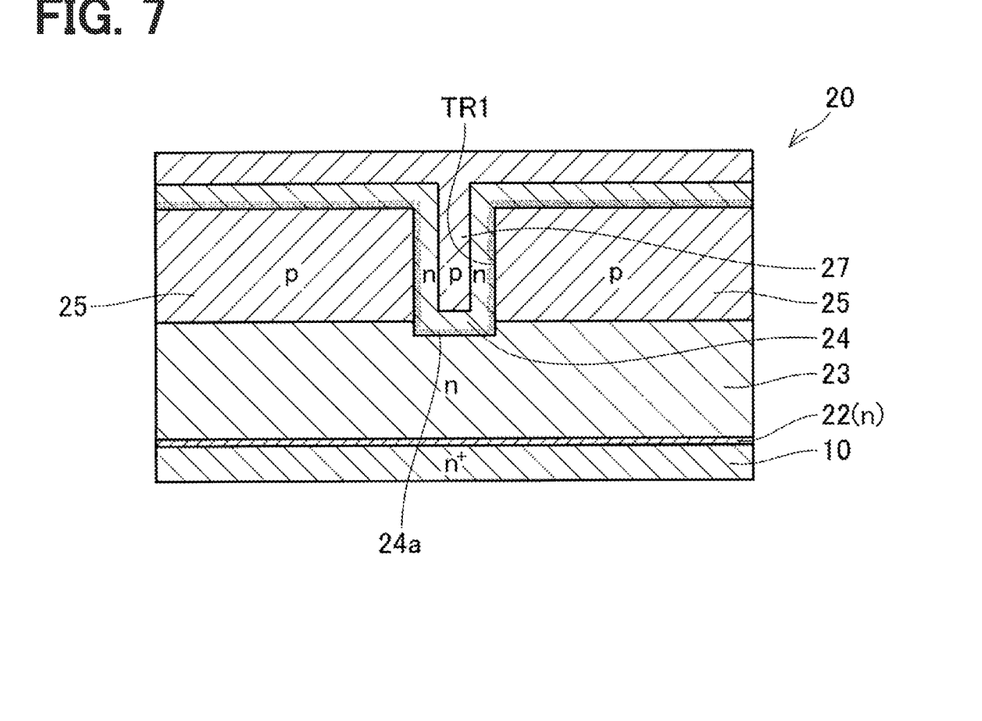
FIG. 7 is a diagram schematically showing a cross-sectional view of the part of the semiconductor device in FIG. 1 in a manufacturing process.

Next, as shown in FIG. 7, the JFET embedded region 27 is formed by crystal growth using the epitaxial growth technique so that a groove defined by the JFET region 24 in the trench TR1 is filled.

Figure 8:
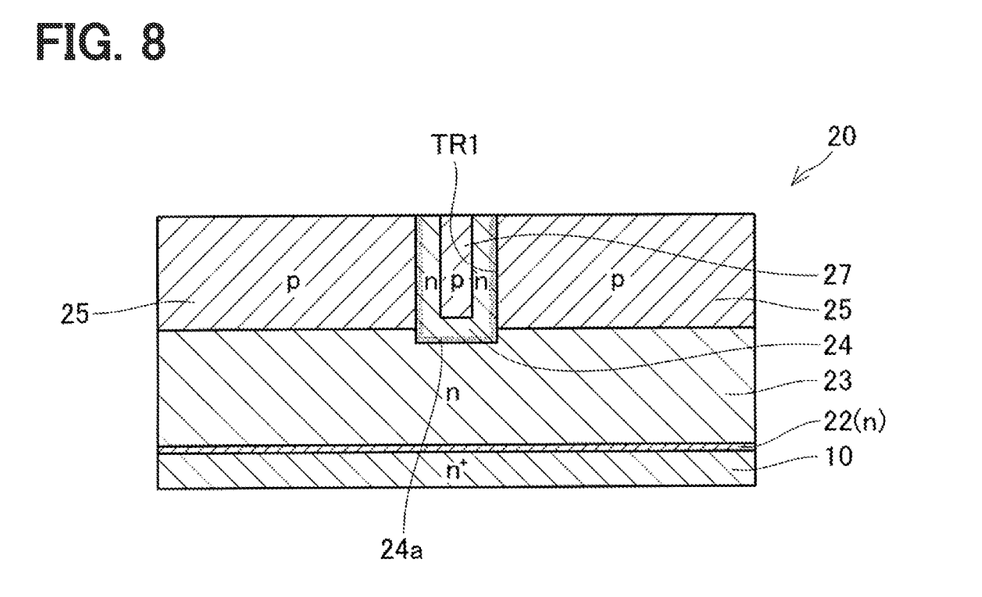
FIG. 8 is a diagram schematically showing a cross-sectional view of the part of the semiconductor device in FIG. 1 in a manufacturing process.

Next, as shown in FIG. 8, the JFET region 24 and the JFET embedded region 27 formed on the upper surface of the body region 25 are removed by using a chemical mechanical polishing (CMP) technique to flatten the upper surface of the compound semiconductor layer 20.

Next, the source region 26, the gate insulating film 36a, the gate electrode 36b, the drain electrode 32, and the source electrode 34 are formed by using a known manufacturing technique, thereby manufacturing the semiconductor device 1 shown in FIG. 1.

(Manufacturing Method of Semiconductor Device 3)

First, in a manufacturing method of the semiconductor device 3, the steps up to the process shown in FIG. 5 are the same as those of manufacturing method of the semiconductor device 1. However, in the manufacturing method of the semiconductor device 3, the process proceeds to the next step without removing the mask 42.

Figure 9:
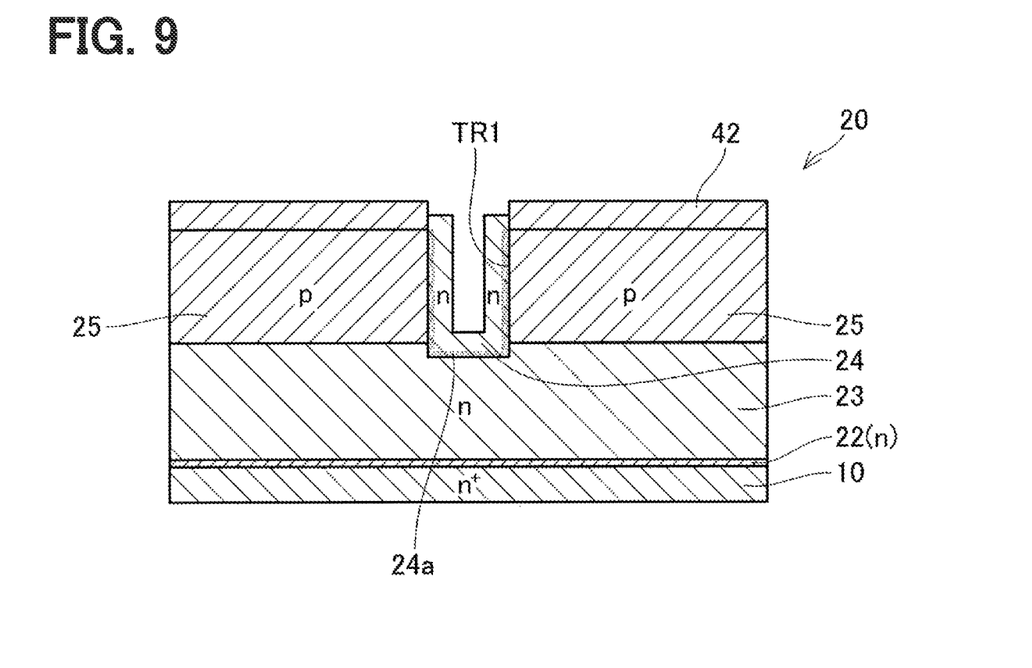
FIG. 9 is a diagram schematically showing a cross-sectional view of the part of the semiconductor device in FIG. 3 in a manufacturing process.

As shown in FIG. 9, the JFET region 24 is formed on the inner wall surface of the trench TR1 by crystal growth using the epitaxial growth technique. In the forming of the JFET region 24, the crystal growth of the JFET region 24 is stopped before the trench TR1 is completely filled. As shown in FIG. 9, a large amount of impurities such as silicon, oxygen, and carbon are incorporated into an initial layer when the JFET region 24 is grown, and a high concentration portion 24a is formed. Here, the material of the mask 42 is silicon oxide, which is a different material from gallium nitride (GaN). Therefore, the JFET region 24 does not grow from the surface of the mask 42. Therefore, the upper surface of the mask 42 is not covered by the JFET region 24. Further, an upper portion of the side surface of the mask 42 located above the trench TR1 is also not covered by the JFET region 24. The JFET region 24 that covers a lower portion of the side surface of the mask 42 is a portion in which the JFET region 24 in the trench TR1 grows upward.

Figure 10:
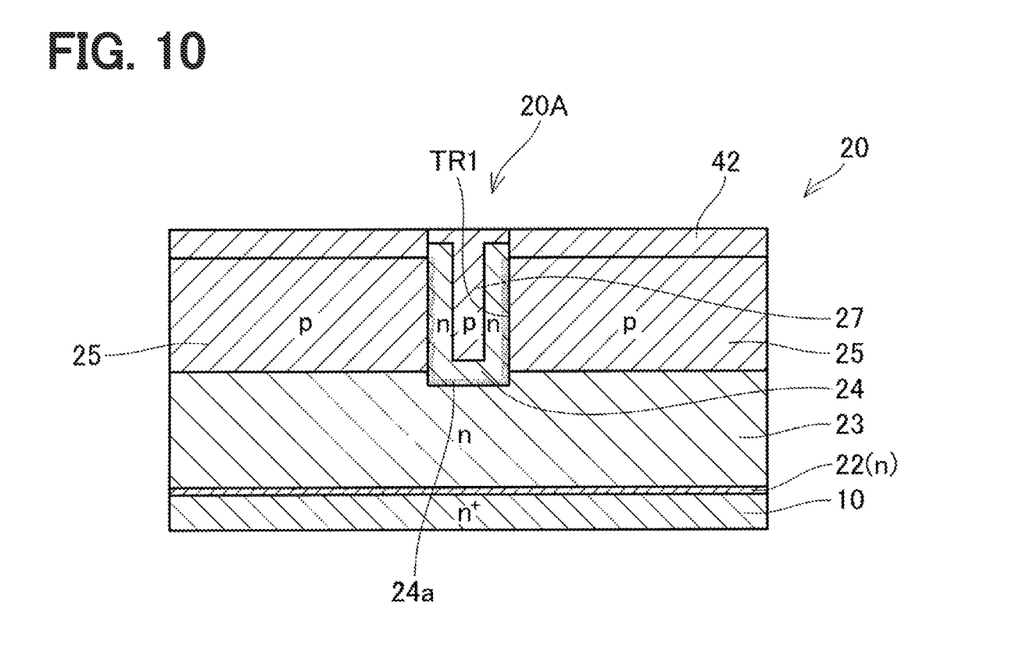
FIG. 10 is a diagram schematically showing a cross-sectional view of the part of the semiconductor device in FIG. 3 in a manufacturing process.

Next, as shown in FIG. 10, the JFET embedded region 27 is formed by crystal growth using the epitaxial growth technique so that a groove defined by the JFET region 24 in the trench TR1 is filled. As a result, the convex portion 20A of the compound semiconductor layer 20 is formed above the trench TR1. Further, since the JFET region 24 is formed so that the upper portion of the side surface of the mask 42 is exposed as described above, a part of the JFET embedded region 27 is formed so as to have the T-shaped cross section.

Figure 11:
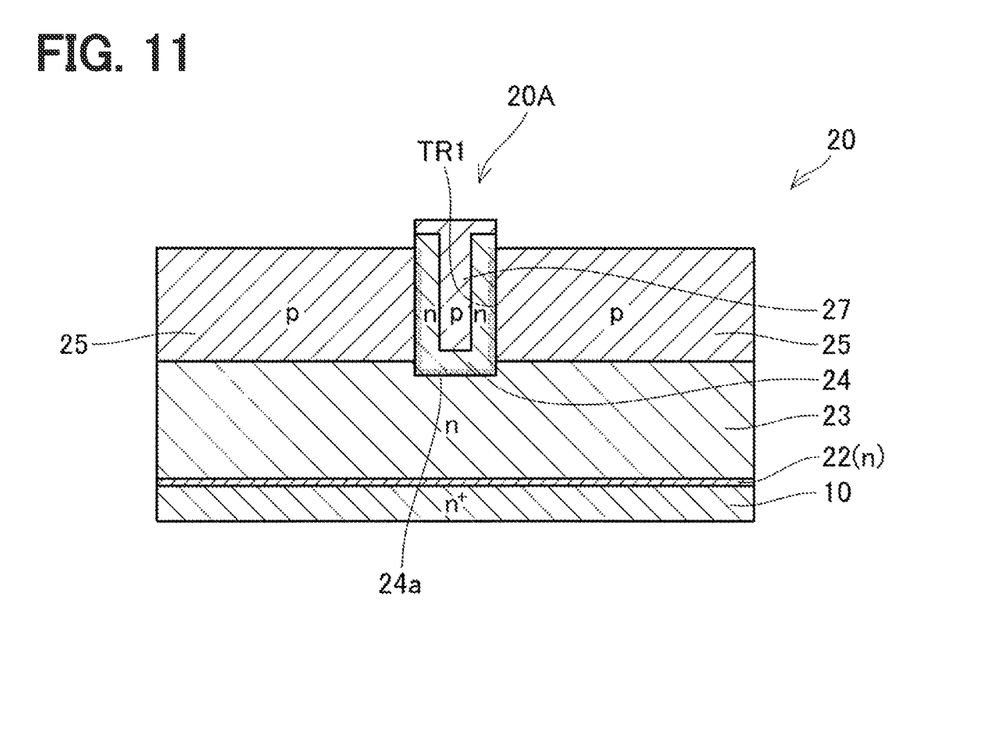
FIG. 11 is a diagram schematically showing a cross-sectional view of the part of the semiconductor device in FIG. 3 in a manufacturing process.
Figure 12:
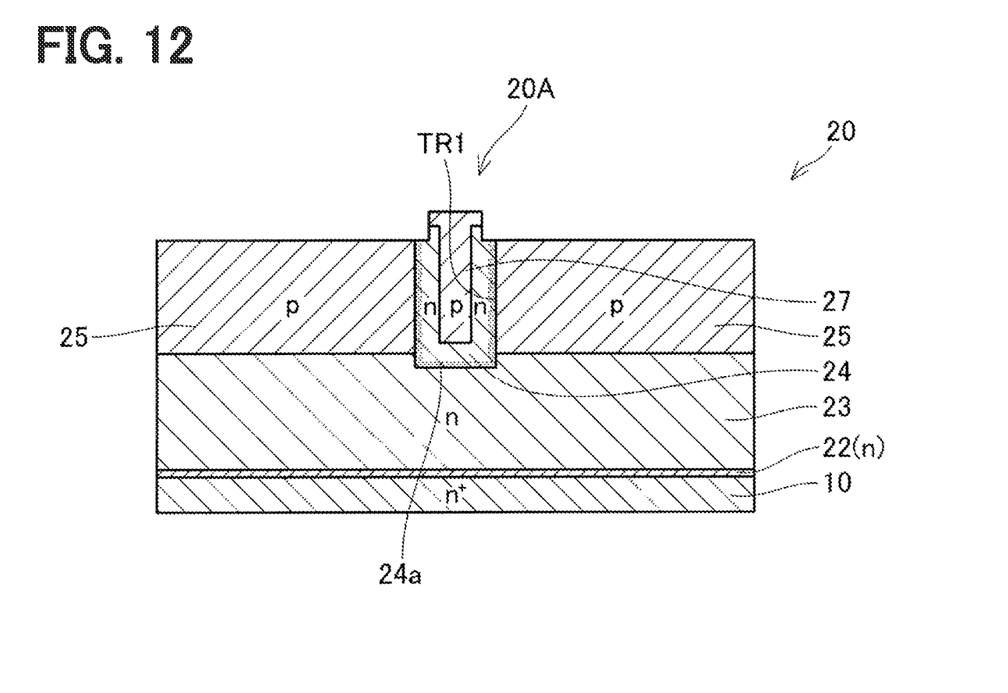
FIG. 12 is a diagram schematically showing a cross-sectional view of the part of the semiconductor device in FIG. 3 in a manufacturing process.

Next, as shown in FIG. 11, the mask 42 is selectively removed by using a wet etching technique. Further, as shown in FIG. 12, a part of the upper surface of the compound semiconductor layer 20 including the convex portion 20A is thinly removed by a tetramethylammonium hydroxide (TMAH) treatment. Accordingly, the width of the convex portion 20A becomes narrower. By adjusting the TMAH treatment conditions, the convex portion 20A can be processed into a tapered shape. In this case, the semiconductor device 4 shown in FIG. 4 can be manufactured.

Next, the source region 26, the gate insulating film 36a, the gate electrode 36b, the drain electrode 32, and the source electrode 34 are formed by using a known manufacturing technique, thereby manufacturing the semiconductor device 3 shown in FIG. 3.

Compared with the manufacturing method of the semiconductor device 1 in FIG. 1, this manufacturing method does not require a flattening step using the CMP technique. Therefore, the manufacturing process can be simplified. In other words, it can be said that the semiconductor devices 3 and 4 shown in FIGS. 3 and 4 have structures that are easier to manufacture than the semiconductor device 1 shown FIG. 1.

The features of the techniques disclosed in the present disclosure are summarized below. It should be noted that the technical elements described below are independent technical elements and exhibit technical usefulness alone or in various combinations, and are not limited to the combinations described in the claims at the time of filing.

A semiconductor device according to the present disclosure may have a compound semiconductor layer. The compound semiconductor layer is not particularly limited, but may be, for example, a nitride semiconductor layer, a silicon carbide layer, or a gallium oxide layer. The compound semiconductor layer may include a drift region of a first conductivity type, a JFET region of the first conductivity type disposed above the drift region, a body region of a second conductivity type disposed above the drift region and adjacent to the JFET region, and a JFET embedded region of the second conductivity type or i-type disposed in the JFET region. The JFET region may be disposed above the drift region so as to be in direct contact with the drift region, or may be disposed above the drift region via another region. The body region may be disposed above the drift region so as to be in direct contact with the drift region, or may be disposed above the drift region via another region. The JFET region may include a high impurity concentration region at a bottom surface portion adjacent to the drift region and a side surface portion adjacent to the body region. The high impurity concentration region has a higher impurity concentration than an inside portion adjacent to the JFET embedded region.

In the semiconductor device, the JFET embedded region may be electrically connected to the source electrode. Depletion is promoted from a junction surface between the JFET embedded region and the JFET region toward the JFET region.

In the semiconductor device, the JFET region may have a tapered shape that tapers toward a deep part of the compound semiconductor layer. In this case, the JFET embedded region may also have a tapered shape that tapers toward the deep part of the compound semiconductor layer. When the JFET region and the JFET embedded region are formed by crystal growth, the formation of voids can be suppressed.

In the semiconductor device, the compound semiconductor layer may have a convex portion formed by projecting a part of the upper surface of the compound layer. In this case, a part of the JFET region and a part of the JFET embedded region may be provided in the convex portion. The semiconductor device having the convex portion has a structure that is easy to manufacture.

The semiconductor device may further include an insulating gate. In this case, a pn junction surface between the JFET region and the body region may be arranged at a position exposed on the upper surface of the compound semiconductor layer on the side of the convex portion. The insulating gate may be disposed so as to face the pn junction surface of the JFET region and the body region. The inversion layer formed in the body region can be reliably connected to the JFET region.

In the semiconductor device, the insulating gate may be disposed so as to face the side surface of the convex portion. In this case, the convex portion may have a tapered shape that tapers upward of the compound semiconductor layer. The electric field concentration of the insulated gate can be relaxed.

In the semiconductor device, the JFET embedded region may be disposed at a position exposed on the entire top surface of the convex portion. For example, when the JFET embedded region is connected to the source electrode, the JFET embedded region and the source electrode can be electrically connected with a low contact resistance.

A manufacturing method according to a present disclosure may include: forming a trench from a surface of a compound semiconductor layer, in which a drift region of a first conductivity type and a body region of a second conductivity type are laminated, to reach the drift region through the body region; forming a JFET region in the trench by crystal growth and stopping the crystal growth of the JFET region before the trench is completely filled, the JFET region made of a compound semiconductor of a first conductivity type; and forming a JFET embedded region in a groove defined by the JFET region in the trench by crystal growth, the JFET embedded region made of a compound semiconductor of a second conductivity type or i-type. The compound semiconductor layer is not particularly limited, but may be, for example, a nitride semiconductor layer, a silicon carbide layer, or a gallium oxide layer.

In the manufacturing method, the forming of the JFET region and the forming of the JFET embedded region may be performed in a state where a mask that is formed for forming the trench remains. According to this manufacturing method, it is possible to form a convex portion in which a part of the upper surface of the compound semiconductor layer is formed in a convex shape. According to this manufacturing method, the subsequent flattening step can be eliminated.

Although specific examples of the present disclosure have been described in detail above, these are merely examples and do not limit the scope of claims. The techniques described in the claims include various modifications and modifications of the specific examples illustrated above. In addition, the technical elements described in the present description or the drawings exhibit technical usefulness alone or in various combinations, and are not limited to the combinations described in the claims at the time of filing. In addition, the techniques illustrated in the present specification or drawings can achieve multiple purposes at the same time, and achieving one of the purposes itself has technical usefulness.

What is claimed is:

1. A semiconductor device comprising a compound semiconductor layer that includes:
    a drift region of a first conductivity type;
    a junction field-effect transistor (JFET) region of the first conductivity type disposed above the drift region;
    a body region of a second conductivity type disposed above the drift region and adjacent to the JFET region; and
    a JFET embedded region of the second conductivity type or i-type disposed in the JFET region, wherein
    the JFET region has a bottom surface portion adjacent to the drift region, a side surface portion adjacent to the body region, and an inside portion adjacent to the JFET embedded region,
    the JFET region further has a high concentration portion at the bottom surface portion and the side surface portion, and
    the high concentration portion has an impurity concentration higher than an impurity concentration of the inside portion.

2. The semiconductor device according to claim 1, further comprising
    a source electrode electrically connected with the JFET embedded region.

3. The semiconductor device according to claim 1, wherein
    the JFET region has a tapered shape that tapers toward a deep part of the compound semiconductor layer.

4. The semiconductor device according to claim 3, wherein
    the JFET embedded region has a tapered shape that tapers toward the deep part of the compound semiconductor layer.

5. The semiconductor device according to claim 1, wherein
    the compound semiconductor layer includes a convex portion in which a part of an upper surface of the compound semiconductor layer protrudes, and
    a part of the JFET region and a part of the JFET embedded region are disposed in the convex portion.

6. The semiconductor device according to claim 5, further comprising
    an insulating gate portion, wherein
    a pn junction surface between the JFET region and the body region is disposed at a position exposed on the upper surface of the compound semiconductor layer on a side of the convex portion, and
    the insulating gate portion is disposed to face the pn junction surface between the JFET region and the body region.

7. The semiconductor device according to claim 6, wherein
    the insulating gate portion is disposed to face a side surface of the convex portion, and
    the convex portion has a tapered shape that tapers upward of the compound semiconductor layer.

8. The semiconductor device according to claim 5, wherein
    the JFET embedded region is disposed at a position exposed on an entire top surface of the convex portion.

9. The semiconductor device according to claim 1, wherein
    the compound semiconductor layer is a nitride semiconductor layer.

* * * * *